(12) United States Patent
Huang

(10) Patent No.: US 8,299,479 B2
(45) Date of Patent: Oct. 30, 2012

(54) LIGHT-EMITTING DEVICES WITH TEXTURED ACTIVE LAYER

(75) Inventor: Hsin-Chieh Huang, Hsin-Chu (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 193 days.

(21) Appl. No.: 12/720,462

(22) Filed: Mar. 9, 2010

(65) Prior Publication Data

US 2011/0220930 A1 Sep. 15, 2011

(51) Int. Cl.
*H01L 33/02* (2010.01)
*H01L 33/20* (2010.01)

(52) U.S. Cl. ........... 257/94; 257/79; 257/E33.005; 257/E33.067; 257/E33.068

(58) Field of Classification Search ............ None
See application file for complete search history.

(56) References Cited

U.S. PATENT DOCUMENTS

| | | | |
|---|---|---|---|
| 4,868,614 A * | 9/1989 | Yamazaki | 257/65 |
| 5,061,974 A * | 10/1991 | Onodera et al. | 257/88 |
| 5,115,443 A * | 5/1992 | Miyazawa | 372/46.01 |
| 5,153,890 A * | 10/1992 | Bona et al. | 372/46.012 |
| 5,400,356 A * | 3/1995 | Bringans et al. | 372/46.01 |
| 7,030,421 B2 * | 4/2006 | Okuyama et al. | 257/89 |
| 7,419,912 B2 | 9/2008 | Donofrio | |
| 7,982,205 B2 * | 7/2011 | Wang | 257/13 |
| 2006/0094244 A1 * | 5/2006 | Yamada et al. | 438/700 |
| 2006/0131590 A1 * | 6/2006 | Takakura et al. | 257/79 |
| 2008/0048176 A1 * | 2/2008 | Orita et al. | 257/22 |
| 2008/0308835 A1 * | 12/2008 | Pan | 257/103 |
| 2009/0032799 A1 * | 2/2009 | Pan | 257/13 |
| 2009/0179211 A1 * | 7/2009 | Yoo et al. | 257/98 |
| 2009/0242918 A1 | 10/2009 | Edmond et al. | |
| 2010/0032700 A1 * | 2/2010 | Yu et al. | 257/98 |
| 2010/0265981 A1 * | 10/2010 | Hiroyama et al. | 372/49.01 |
| 2010/0308437 A1 * | 12/2010 | Okuno et al. | 257/615 |

OTHER PUBLICATIONS

Mori, Yoshifumi. "Single Mode Laser with a V-shaped Active Layer Grown by Metalorganic Chemical Vapor Deposition: A V-shaped Double Heterostructure Laser." Journal of Applied Physics 52.9 (1981): 5429.*
Kneissl, M., D. Hofstetter, P. Bour, R. Donaldson, J. Walker, and N. M. Johnson. "Dry-etching and Characterization of Mirrors on III-nitride Laser Diodes from Chemically Assisted Ion Beam Etching." Journal of Crystal Growth 189-190 (1998): 846-49.*

\* cited by examiner

*Primary Examiner* — Victor A Mandala
*Assistant Examiner* — Joseph Schoenholtz
(74) *Attorney, Agent, or Firm* — Haynes and Boone, LLP

(57) ABSTRACT

A device includes a textured substrate having a trench extending from a top surface of the textured substrate into the textured substrate, wherein the trench comprises a sidewall and a bottom. A light-emitting device (LED) includes an active layer over the textured substrate. The active layer has a first portion parallel to the sidewall of the trench and a second portion parallel to the bottom of the trench.

20 Claims, 8 Drawing Sheets

LIGHT-EMITTING DEVICES WITH TEXTURED ACTIVE LAYER

TECHNICAL FIELD

This disclosure relates generally to light-emitting devices (LEDs), and more particularly to the methods of manufacturing LEDs with textured active layers and the resulting structures.

BACKGROUND

Light-emitting devices (LEDs), such as light-emitting diodes or laser diodes, are widely used for many applications. As is well known to those skilled in the art, an LED may include a semiconductor light-emitting element having a plurality of semiconductor layers formed on a substrate. The substrate may be formed of, for example, gallium arsenide, gallium phosphide, alloys thereof, silicon carbide, and/or sapphire. Continued development in LEDs has resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

LEDs emit light from active layers. Accordingly, light may be extracted from the opposite sides of the active layers. However, in certain situations, for example, when an LED is used for illumination, it may be preferred that the light is directed to only one side of the LED, with the light being scattered to achieve a more uniform light distribution. Conventionally, patterned package substrates were bonded to LED chips to re-direct light to desirable directions. This solution, however, results in an increase in the cost and complexity in the formation of the package substrates and the bonding process for bonding LED chips to the package substrates. In addition, the solutions in package substrates did not help improve the light-extraction efficiency.

SUMMARY

In accordance with one aspect, a device includes a textured substrate having a trench extending from a top surface of the textured substrate into the textured substrate, wherein the trench comprises a sidewall and a bottom. A light-emitting device (LED) includes an active layer over the textured substrate. The active layer has a first portion parallel to the sidewall of the trench and a second portion parallel to the bottom of the trench.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel light-emitting device (LED) in accordance with an embodiment and the method of forming the same are presented. The intermediate stages of manufacturing an embodiment are illustrated. The variations and the operation of the embodiment are then discussed. Throughout the various views and illustrative embodiments, like reference numbers are used to designate like elements.

Figure 1:
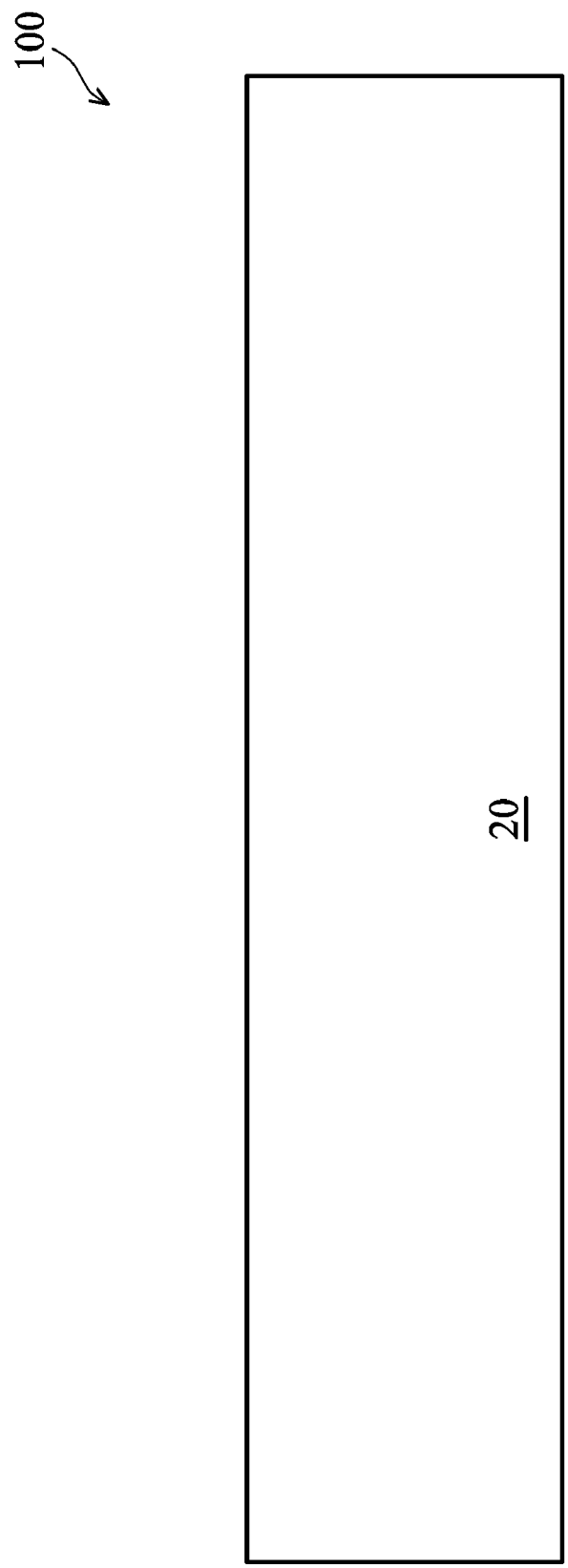
FIGS. 1 through 5 are cross-sectional views and top views of intermediate stages in the manufacturing of a light-emitting device (LED) in accordance with an embodiment, which LED is formed on a textured substrate.

Referring to FIG. 1, chip 100, which comprises substrate 20, is provided. Chip 100 may be a part of an un-diced wafer comprising a plurality of identical chips. In an embodiment, substrate 20 is formed of sapphire ($Al_2O_3$). In alternative embodiments, substrate 20 is a silicon-containing substrate, such as a silicon carbide substrate or silicon. In yet other embodiments, substrate 20 comprises compound semiconductor materials comprising group-III and/or group-V elements, or also known as III-V compound semiconductor materials.

Figure 2:
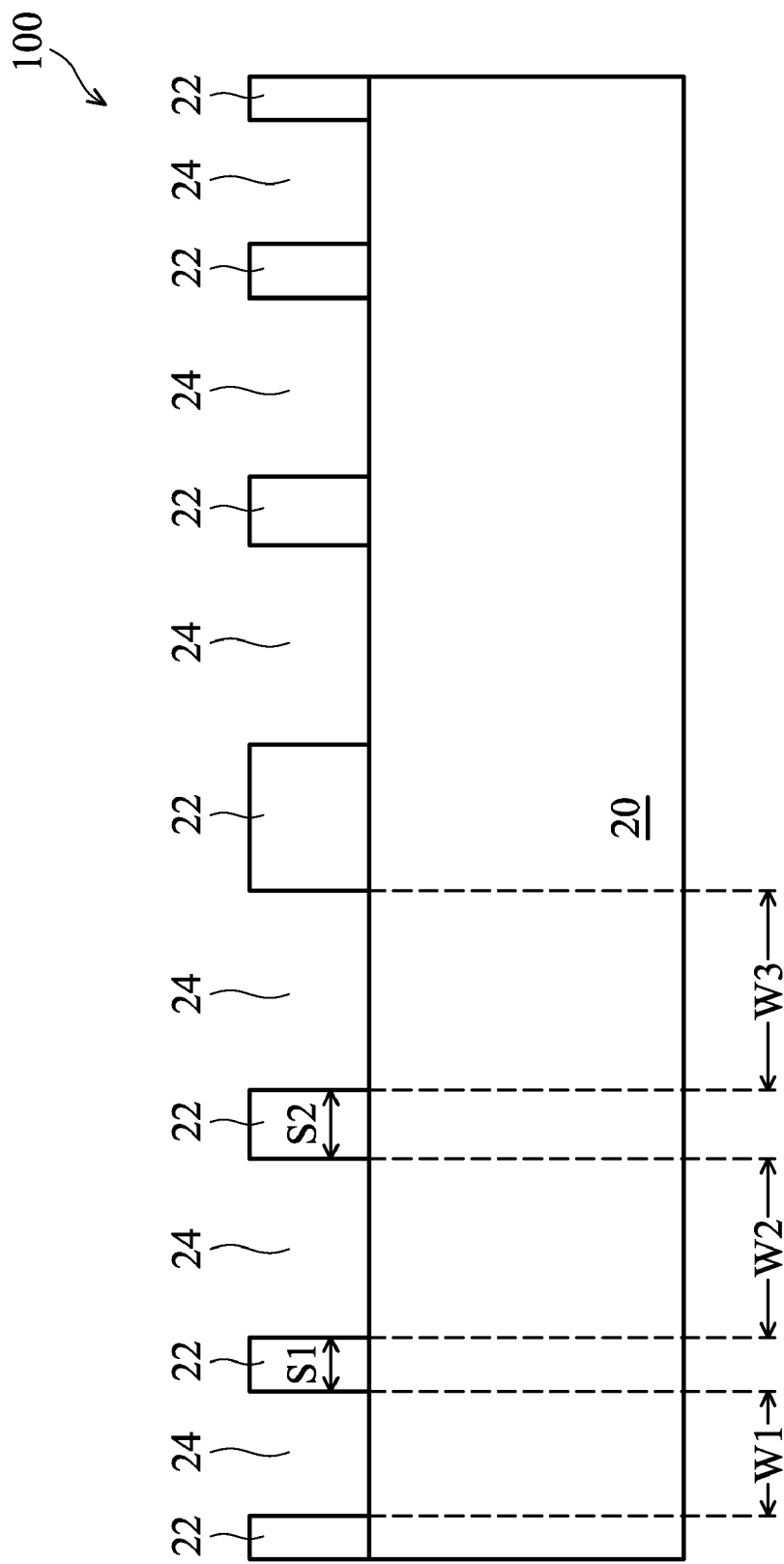

Photo resist 22 is formed on substrate 20 and is patterned to form a plurality of openings 24, as shown in FIG. 2. In an embodiment, the horizontal dimensions (widths or lengths, for example, W1, W2, and W3) of openings 24 may be different from opening to opening, although the horizontal dimensions of openings 24 may also be the same throughout chip 100. Further, spacings (for example, S1 and S2) between neighboring openings 24 may be the same or different from each other. Accordingly, the pattern densities of openings 24 may have variations in different regions of chip 100, wherein the pattern density of openings 24 in a region equals the total area of openings 24 in the region divided by the total area of the region. In the embodiment wherein the horizontal dimensions and spacings of openings 24 are substantially uniform throughout chip 100, the pattern densities of openings 24 are substantially uniform throughout chip 100.

Figure 3A:
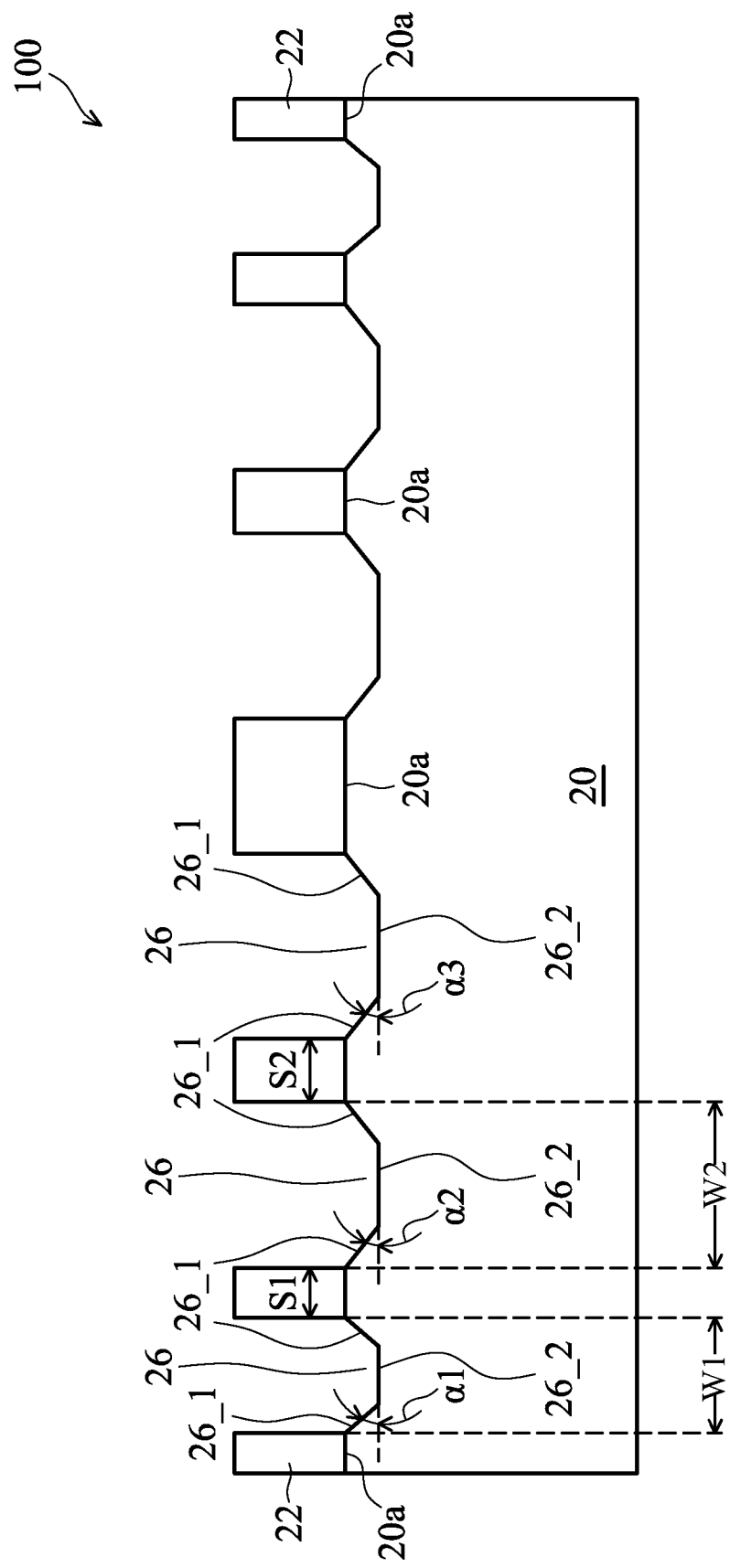

Referring to FIG. 3A, substrate 20 is etched through openings 24 to form a plurality of discrete trenches 26, which extend from top surface 20a of substrate 20 into substrate 20. The resulting substrate 20 is referred to as a textured substrate hereinafter. The resulting surface of substrate 20 that includes trenches 26 is referred to a textured top surface, which comprises portions of the original top surface 20a, sidewalls 26_1 of trenches 26, and bottoms 26_2 of trenches 26. In an embodiment, sidewalls 26_1 and bottoms 26_2 are substantially straight in the cross-sectional view, although they may also be curved. The etching may be a dry etching, although other etching methods may also be used. Through the adjustment of process conditions of the etching process, slant angles $\alpha$ (illustrated as $\alpha 1$, $\alpha 2$, $\alpha 3$, and so on) of sidewalls 26_1 may be adjusted to less than about 45 degrees and greater than about 1 degree (or greater than about 10 degrees or 15 degrees) from horizontal, or between about 10 degrees and about 45 degrees from horizontal, or even between about 15 degrees and about 35 degrees from horizontal. Photo resist 22 is then removed.

Figure 3B:
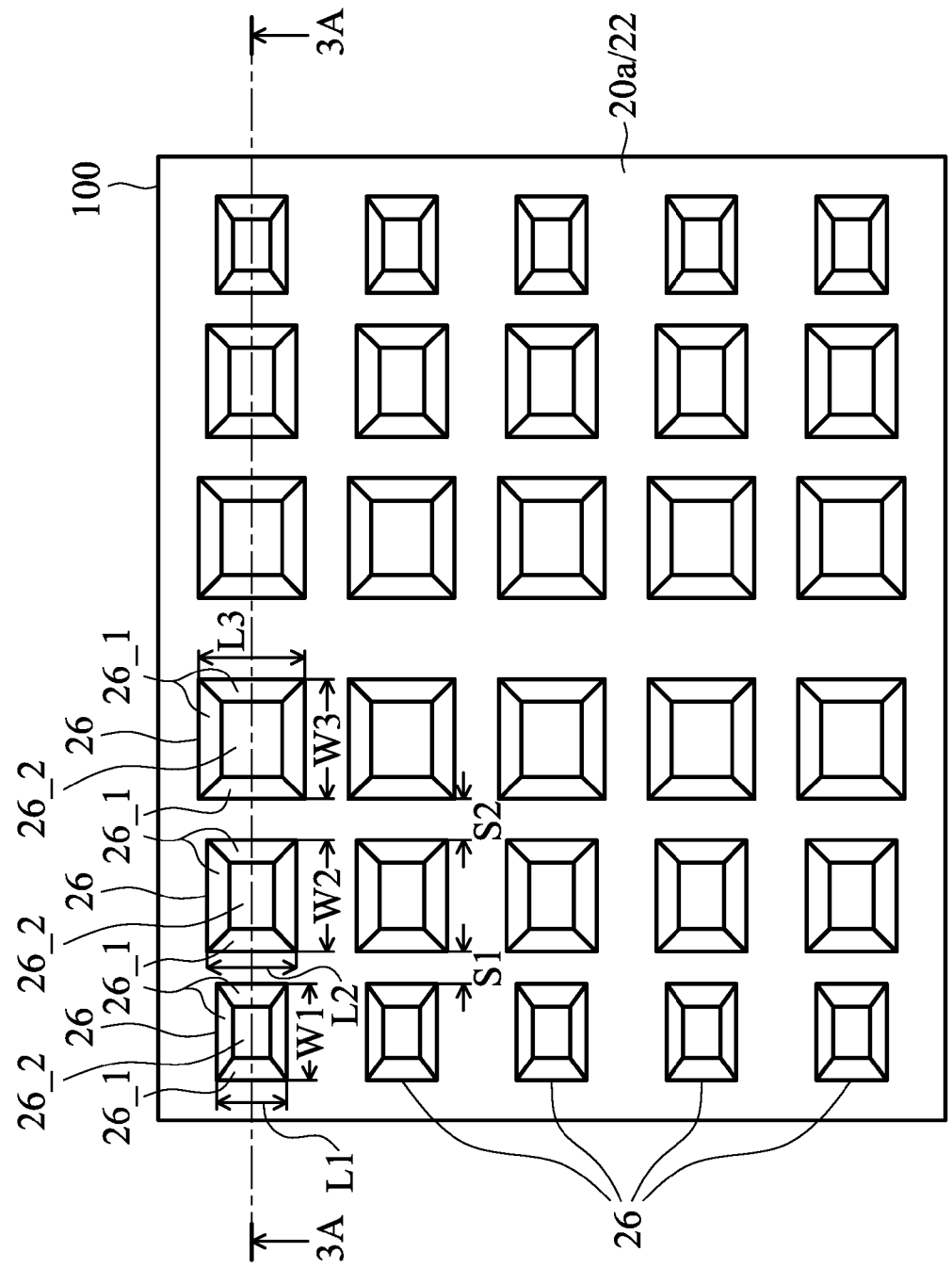
Figure 3C:
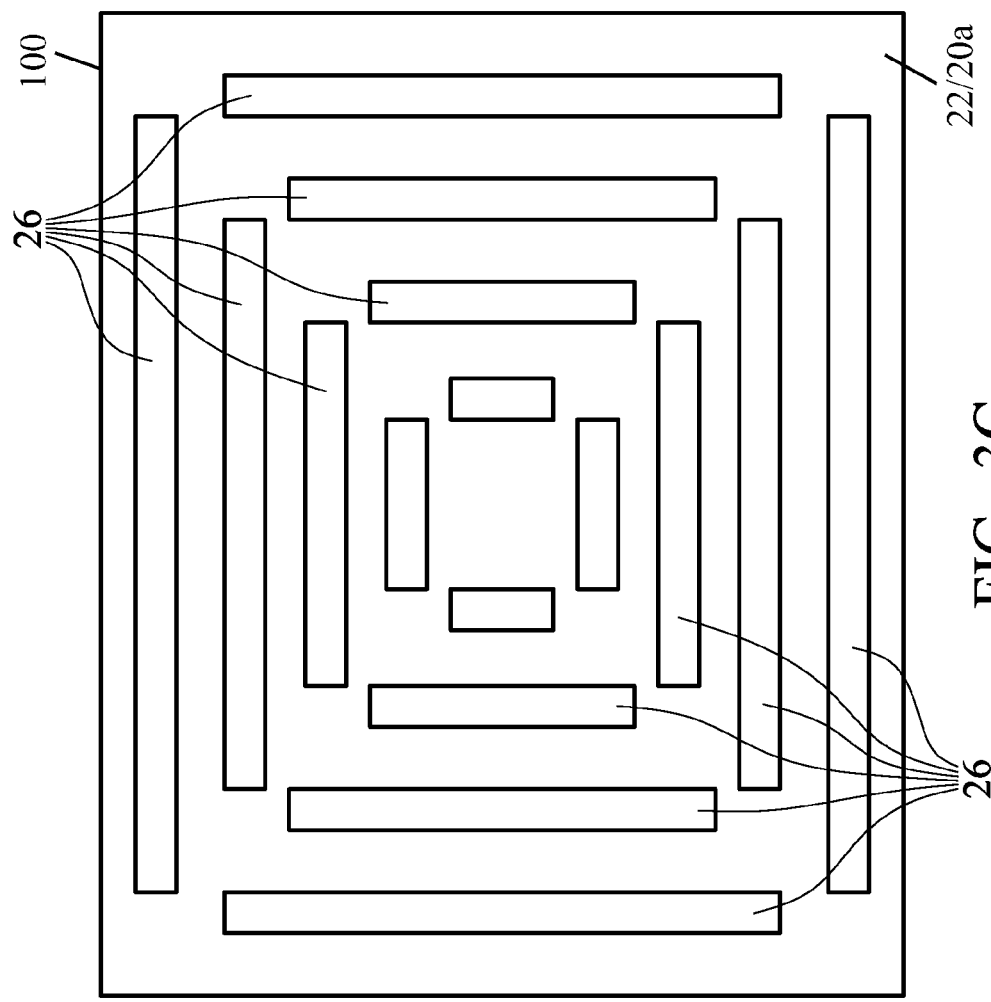
Figure 3D:
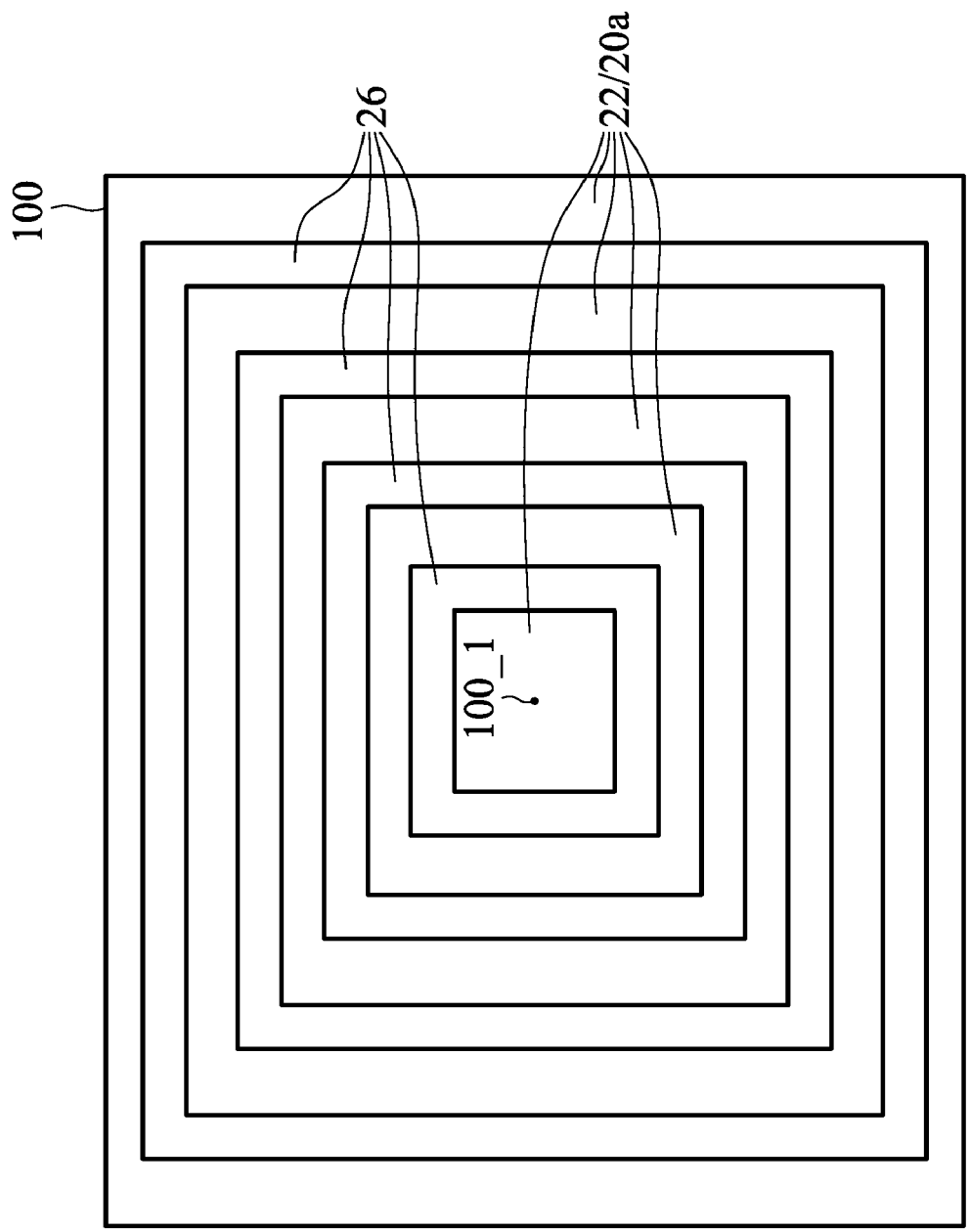

FIG. 3B illustrates a top view of the structure shown in FIG. 3A, wherein the cross-sectional view as shown in FIG. 3A is obtained in the plane crossing line 3A-3A in FIG. 3B. In an embodiment, trenches 26 have rectangular shapes with the respective widths and lengths close to each other (and hence trenches 26 have the shape of squares) in the top view. In alternative embodiments, as shown in FIG. 3C (a top view), trenches 26 may be long strips. In yet other embodiments, as shown in FIG. 3D (also a top view), trenches 26 form closed loops, which may encircle center 100_1 of chip 100, or encircle other selected points in chip 100 other than center 100_1. The dimensions (such as lengths L1-L3 and widths W1-W3 in FIG. 3B) and spacings S (such as spacings S1 and S2 in FIG. 3B) of different trenches 26 may be the same as each other, or different from each other. Further, trenches 26 may be arranged in a periodic pattern or a random pattern.

In the etch step for forming trenches 26, the trenches' profiles in different regions of chip 100 may be adjusted by various known etching techniques and effects. For example, the micro-loading effect is known to affect the profiles for trenches having a width within a certain range. Other known etch techniques can also affect trench profiles, for example, using plasma bombardment or protective additives. Referring back to FIG. 3A, it is observed that slant angle $\alpha 1$ may be different from slant angle $\alpha 2$, and slant angle $\alpha 1$ may be greater (or smaller) than slant angle $\alpha 2$ by about 2 degrees, about 5 degrees, or even by about 10 degrees. In addition, slant angle $\alpha 2$ may be greater (or smaller) than slant angle $\alpha 3$ by about 2 degrees, about 5 degrees, or even greater than about 10 degrees. This may be achieved, for example, by adjusting width W1, width W2, and width W3 relative to each other, depending on the etch technique used. The desirable pattern-loading effects may also be achieved by adjusting spacing S1 relative to spacing S2 and spacing S3. Accordingly, on chip 100, there exists a plurality of slant angles $\alpha$ that is different from each other.

Figure 4:
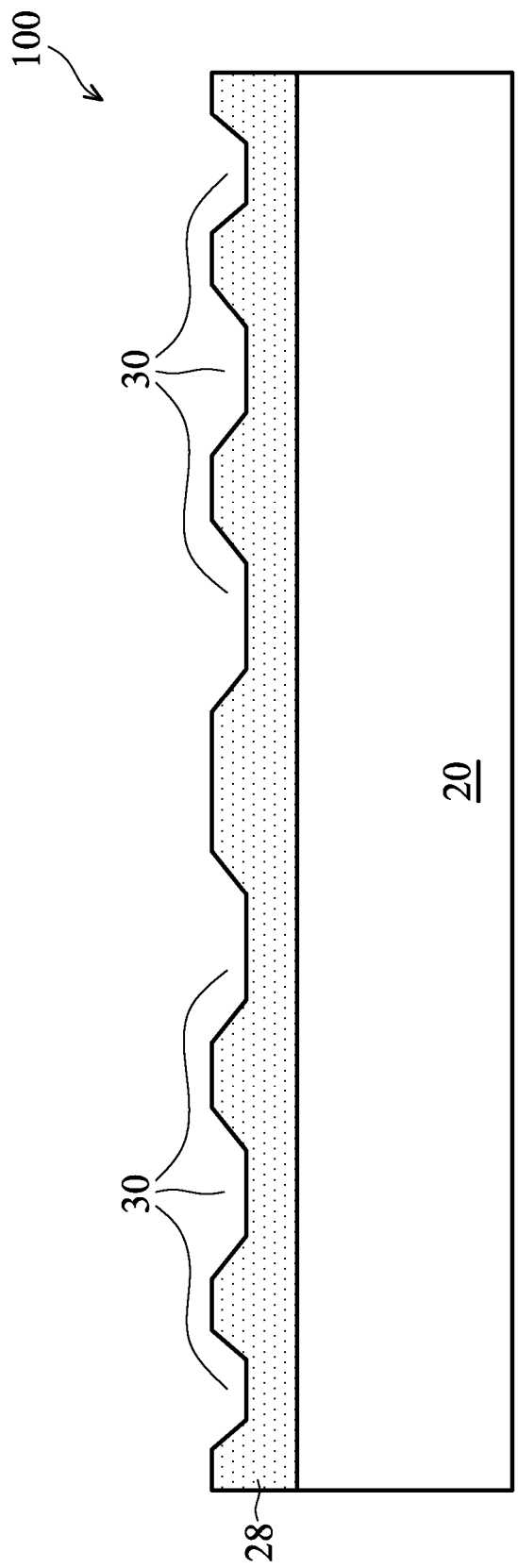

FIG. 4 illustrates a particular embodiment for forming trenches 26 (not shown in FIG. 4, please refer to FIGS. 3A-3D) with desirable slant angles. First, mask 28, which may comprise a polymer, is formed over substrate 20. Trenches 30 are formed in mask 28, for example, using laser micro-machining. The pattern of trenches 30 may be similar to the pattern of trenches 26. However, the aspect ratios of trenches 30 may be the same as, or different from, the respective aspect ratios of trenches 26. Mask 28 and the underlying substrate 20 are then etched using an etchant that attacks both substrate 20 and mask 28, with a desirable etching selectivity, for example, between about 0.5 and about 2. During the etching process, the exposed portions of substrate 20 and mask 28 are both etched when they are exposed to the etchant. However, in locations where the mask 28 is thicker, it takes more time to etch mask 28 before substrate 20 is exposed to the etchant. Accordingly, the pattern in mask 28 is transferred to substrate 20. In the embodiments wherein substrate 20 and mask 28 have a same etching rate (with etching selectivity close to 1), the patterns in mask 28 are transferred to the underlying substrate 20 substantially accurately. In the embodiments wherein substrate 20 has a greater etching rate than mask 28, trenches 26 (not shown in FIG. 4, please refer to FIG. 3A) have higher aspect ratios than the respective overlying trenches 30. Conversely, in the embodiments wherein substrate 20 has a lower etching rate than mask 28, trenches 26 have lower aspect ratios than the respective overlying trenches 30. The resulting textured substrate 20 is similar to the textured substrate 20 shown in FIG. 3A. In yet other embodiments, instead of using etching to form textured substrate 20, laser micro-machining may also be performed directly on substrate 20 to form trenches 26 with desirable profiles.

Figure 5:
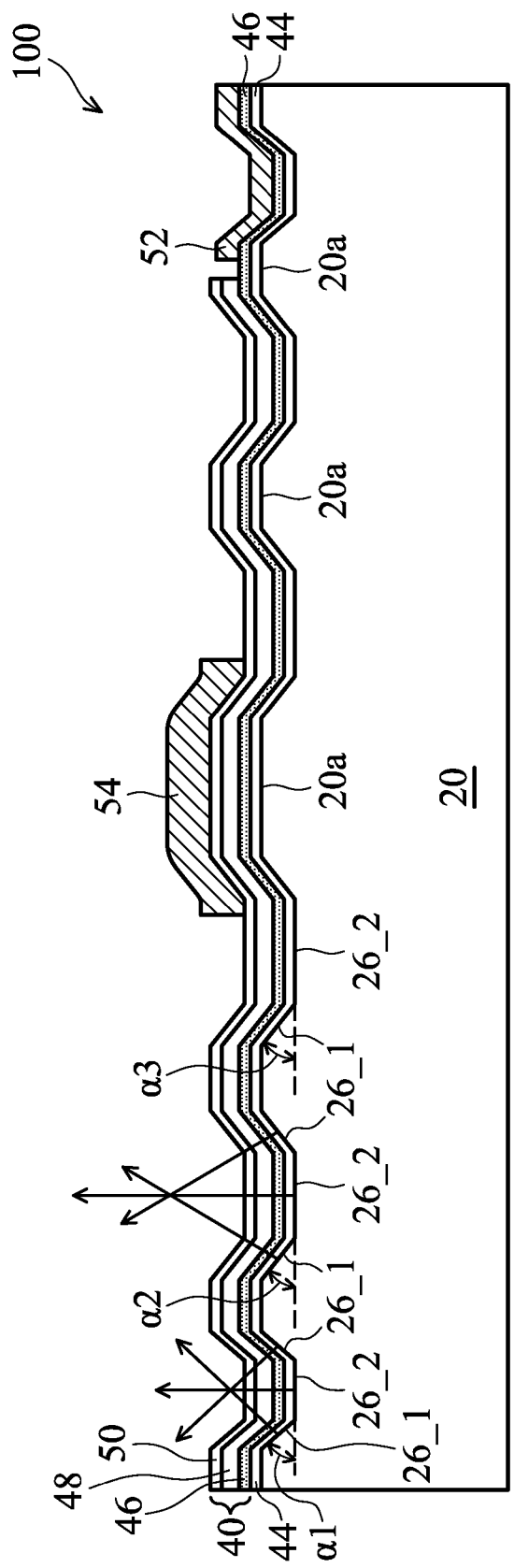

Next, as shown in FIG. 5, LED 40 is formed on the textured top surface of textured substrate 20. In an exemplary embodiment, buffer layer 44 is formed on substrate 20 and may contact the textured top surface of substrate 20. Buffer layer 44 may comprise un-doped gallium nitride. A plurality of layers of LED 40 is then formed on buffer layer 44. LED 40 may include cladding layer 46 of a first conductivity type over buffer layer 44, at least one multiple quantum well (MQW) 48 that acts as an active layer for emitting light over cladding layer 46, and cladding layer 50 of a second conductivity type opposite the first conductivity type over MQW 48. In an exemplary embodiment, cladding layer 46 is an n-GaN layer (GaN doped with an n-type impurity), MQW 48 is formed of InGaN, and cladding layer 50 is a p-GaN layer (GaN doped with a p-type impurity). Top electrodes (which are also bond pads formed of metals) 52 and 54 are formed to electrically connect to cladding layers 46 and 50, respectively. Accordingly, by applying a voltage between electrodes 52 and 54, LED 40 may be activated to emit light. It is realized that LED 40 may have many designs, which are also in the scope of the present disclosure. When the depths of trenches 26 are great enough, each of layers 44, 46, 48, 50, 52, and 54 may have portions extending into trenches 26. Alternatively, if trenches 26 are relatively shallow, only the lower ones of layers 44, 46, 48, 50, 52, and 54 have portions extending into trenches 26, while upper ones of these layer are over top surface 20a of substrate 20, which means that each of layers 44, 46, 48, 50, 52, and 54 comprises portions parallel to sidewalls 26_1, portions parallel to bottoms 26_2, and portions parallel to top surface 20a.

The formation methods of layers 46, 48, and 50 include epitaxial growth. Top electrodes 52 and 54 may be formed using a physical vapor deposition method, for example, sputtering, although other methods may also be used. The process details may be realized by one skilled in the art, and hence are not discussed in detail herein.

Layers 44, 46, 48, 50, 52, and 54 are non-flat layers, and may be conformal textured layers, which means that portions of these layers on sidewalls 26_1 of trenches 26 have substantially the same thickness as the portions of the respective layers at bottoms 26_2 of trenches 26, and substantially the same thickness as the portions of the respective layers on the un-etched portions of top surface 20a of substrate 20. Accordingly, each of layers 44, 46, 48, 50, 52, and 54 may follow the profile of the textured top surface of substrate 20.

In the cross-sectional view as shown in FIG. 5, it is observed that due to the different slant angles $\alpha$ (denoted as $\alpha 1$, $\alpha 2$, and $\alpha 3$) of sidewalls 26_1, active layer 48 includes portions having different slant angles. Therefore, the light emitted from different portions of active layer 48 with different slant angles $\alpha$ is directed to different directions. For example, FIG. 5 schematically illustrates five possible directions of light (although light is also emitted to other directions), which directions are perpendicular to the top surfaces of the respective portions of active layer 48. With more trenches 26 having different slant angles, the number of light directions is further increased. Accordingly, the light emitted by LED 40 is scattered more uniformly.

It is observed that with active layer 48 having a non-flat profile, the area of active layer 48 is increased over the case if active layer 48 is a flat layer parallel to the top surface 20a of substrate 20. Accordingly, the light output area is increased and the light amount emitted from a single chip is also increased. Further, the light emitted from the embodiments is scattered more uniformly, making it more suitable for illumination applications, such as light bulbs. The scattering of the light may be implemented by forming trenches directly in the substrates on which LEDs are formed, rather than package substrates. Accordingly, the embodiments provide a manufacturing process involving a low cost and low complexity.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a textured substrate comprising a first trench and a second trench each extending from a top surface of the textured substrate into the textured substrate, wherein the first trench comprises a first sidewall and a first bottom, wherein the second trench comprises a second sidewall and a second bottom, and wherein a first slant angle of the first sidewall is different from a second slant angle of the second sidewall; and
    a light-emitting device (LED) over the textured substrate and comprising an active layer, wherein the active layer comprises a first portion parallel to the first sidewall, a second portion parallel to the first bottom, and a third portion parallel to the second sidewall.

2. The device of claim 1, wherein the first and the second portions of the active layer are inside the first trench, and wherein the active layer further comprises a third fourth portion over the top surface of the textured substrate.

3. The device of claim 1, wherein the LED further comprises a first cladding layer and a second cladding layer of opposite conductivity types, and wherein the first and the second cladding layers are on opposite sides of the active layer.

4. The device of claim 1
    wherein the active layer comprises a fourth portion parallel to the second bottom.

5. The device of claim 4, wherein a difference between the first slant angle and the second slant angle is greater than about 2 degrees.

6. The device of claim 5, wherein the difference between the first slant angle and the second slant angle is greater than about 5 degrees.

7. The device of claim 1, wherein the first sidewall has a slant angle less than about 45 degrees from horizontal.

8. A device comprising:
    a textured substrate comprising a textured top surface with a top portion, a bottom portion parallel to, and lower than, the top portion, and a slant portion connecting the top portion to the bottom portion and forming a slant angle with the top portion and the bottom portion; and
    a light-emitting device (LED) comprising:
        a first cladding layer of a first conductivity type over the textured top surface;
        an active layer over the first cladding layer; and
        a second cladding layer of a second conductivity type opposite the first conductivity type over the active layer, wherein each of the first cladding layer, the active layer, and the second cladding layer is a conformal textured layer comprising first portions, second portions, and third slant portions, and wherein the second portions are parallel to, and higher than, the first portions, and wherein at least two of the third slant portions have different slant angles from each other.

9. The device of claim 8, wherein a difference between the slant angles of the at least two of the third slant portions is greater than about 5 degrees.

10. The device of claim 8 further comprising a buffer layer between, and adjoining, the first cladding layer and the textured top surface of the textured substrate, wherein the buffer layer is a conformal layer.

11. The device of claim 8 further comprising a metal electrode over and electrically connected to the second cladding layer, wherein the metal electrode comprises a slant portion parallel to one of the third slant portions of the conformal textured layers.

12. The device of claim 8, wherein the third slant portions have slant angles less than about 45 degrees, and greater than about 10 degrees.

13. A device comprising:
    a textured substrate comprising a plurality of trenches each extending from a top surface of the textured substrate into the textured substrate, wherein the trenches each include a respective sidewall and a respective bottom, wherein at least some of the trenches are shaped differently from other trenches; and
    a light-emitting device comprising:
        a first cladding layer of a first conductivity type and over the top surface of the textured substrate;
        an active layer over the first cladding layer; and
        a second cladding layer of a second conductivity type opposite the first conductivity type over the active layer, wherein each of the first cladding layer, the active layer, and the second cladding layer has a non-flat top surface.

14. The device of claim 13, wherein the non-flat top surface of the active layer comprises a first portion over the top surface of the textured substrate, and a second portion extending into the trench.

15. The device of claim 14, wherein the second portion of the non-flat surface of the active layer comprises a sidewall portion parallel to the sidewall of at least one of the trenches, and a bottom portion parallel to the bottom of at least one of the trenches.

16. The device of claim 13 wherein at least some of the trenches are shaped differently from other trenches by having different slant angles.

17. The device of claim 16, wherein a difference between the different slant angles is greater than about 5 degrees.

18. The device of claim 17, wherein the plurality trenches is spaced apart from each other, each trench having a rectangular shape in a top view of the textured substrate.

19. The device of claim 1, wherein the first trench and the second trench each have a substantially rectangular shape in a top view.

20. The device of claim 1, further comprising an illumination application in which the textured substrate and the LED are implemented.

* * * * *